US009355860B2

(12) United States Patent
Liu

(10) Patent No.: US 9,355,860 B2
(45) Date of Patent: May 31, 2016

(54) METHOD FOR ACHIEVING UNIFORM ETCH DEPTH USING ION IMPLANTATION AND A TIMED ETCH

(75) Inventor: Tsu-Jae King Liu, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 579 days.

(21) Appl. No.: 12/352,475

(22) Filed: Jan. 12, 2009

(65) Prior Publication Data

US 2009/0114953 A1 May 7, 2009

Related U.S. Application Data

(62) Division of application No. 11/424,826, filed on Jun. 16, 2006, now Pat. No. 7,494,933.

(51) Int. Cl.
*H01L 21/311* (2006.01)
*H01L 21/3213* (2006.01)
*H01L 21/265* (2006.01)
*H01L 29/66* (2006.01)
*H01L 29/78* (2006.01)

(52) U.S. Cl.
CPC .... *H01L 21/31111* (2013.01); *H01L 21/31116* (2013.01); *H01L 21/32133* (2013.01); *H01L 21/26506* (2013.01); *H01L 29/66795* (2013.01); *H01L 29/7853* (2013.01)

(58) Field of Classification Search
CPC ............... H01L 2924/00; H01L 2224/32225; H01L 2224/48227; H01L 2224/73265; H01L 2924/00014; H01L 2224/73204; H01L 2224/32145; H01L 2224/45124; H01L 2924/12032; H01L 2924/1301; H01L 2924/1305

USPC .......... 438/164, 218, 294, 410, 514; 257/E21.635, 330, 331, 334, E21.345, 257/E21.404
See application file for complete search history.

(56) References Cited

U.S. PATENT DOCUMENTS

| | | | | |
|---|---|---|---|---|
| 6,613,631 | B2 * | 9/2003 | Koishikawa | 438/258 |
| 6,642,090 | B1 * | 11/2003 | Fried et al. | 438/164 |
| 6,716,763 | B2 * | 4/2004 | Li et al. | 438/711 |
| 6,790,745 | B1 | 9/2004 | Blanchard | |

(Continued)

OTHER PUBLICATIONS

Mathew et al., "Inverted T Channel FET (ITFET)—Fabrication and Characteristics of Vertical-Horizontal, Thin Body, Multi-Gate, Multi-Orientation Devices, ITFET SRAM Bit-Cell Operation. A Novel Technology for 45nm and Beyond CMOS", 2005 IEEE, 4 pgs.

(Continued)

*Primary Examiner* — Mary Wilczewski
*Assistant Examiner* — Tsz Chiu
(74) *Attorney, Agent, or Firm* — Bever, Hoffman & Harms, LLLP

(57) ABSTRACT

A method of performing a timed etch of a material to a precise depth is provided. In this method, ion implantation of the material is performed before the timed etch. This ion implantation process substantially enhances the etch rate of the material within a precisely controlled depth range corresponding to the range of implantation-induced damage. By using the ion implantation, the variation in vertical etch depth can be reduced by a factor approximately equal to the etch rate of the damaged material divided by the etch rate of the undamaged material. The vertical etch depth can be used to provide a vertical dimension of a non-planar semiconductor device. Minimizing vertical device dimension variations on a wafer can reduce device and circuit performance variations, which is highly desirable.

10 Claims, 6 Drawing Sheets

(56) References Cited

U.S. PATENT DOCUMENTS

| | | | |
|---|---|---|---|
| 7,482,252 B1* | 1/2009 | Wu et al. | 438/479 |
| 8,384,150 B2* | 2/2013 | Mifuji et al. | 257/328 |
| 2003/0216044 A1 | 11/2003 | Lin et al. | |
| 2004/0222473 A1* | 11/2004 | Risaki | 257/368 |
| 2005/0105034 A1* | 5/2005 | Ono et al. | 349/143 |
| 2005/0116283 A1* | 6/2005 | Yoshida et al. | 257/327 |
| 2005/0173701 A1* | 8/2005 | Kawase et al. | 257/40 |
| 2006/0048572 A1* | 3/2006 | Isogai et al. | 73/335.04 |
| 2013/0228871 A1* | 9/2013 | Huang | H01L 27/088 257/368 |

OTHER PUBLICATIONS

North et al., "Tapered Windows in Phosphorus-Doped SiO2 by Ion Implantation", 1978 IEEE, IEEE Transactions on Electron Devices, vol. ED-25, No. 7, Jul. 1978, pp. 809-812.

Lauwers et al., "CMOS Integration of Dual Work Function Phase Controlled Ni FUSI With Simultaneous Silicidation of NMOS (NiSi) and PMOS (Ni-rich silicide) Gates on HfSiON", 2005 IEEE, 4 pgs.

* cited by examiner

US 9,355,860 B2

METHOD FOR ACHIEVING UNIFORM ETCH DEPTH USING ION IMPLANTATION AND A TIMED ETCH

RELATED APPLICATIONS

This application is a divisional of U.S. patent application Ser. No. 11/424,826, entitled "Method For Achieving Uniform Etch Depth Using $I_{on}$ Implantation And A Timed Etch" filed Jun. 16, 2006.

BACKGROUND OF THE INVENTION

1. Field of the Invention

The present invention relates to the field of semiconductor integrated-circuit (IC) manufacturing, and in particular a technique of providing uniform etch depth by using ion implantation and a timed etch.

2. Description of the Related Art

The vertical dimensions of semiconductor devices (e.g. capacitors, transistors) with non-planar surfaces are often defined simply by a timed etch of a homogeneous dielectric (e.g. oxide) material that serves to electrically isolate semiconductor device regions. For example, FIG. 1A illustrates a cross-sectional view of a patterned silicon layer 101 and dielectric areas 102 that can provide electrical isolation. During the process of forming devices in patterned silicon layer 101, dielectric areas 102 can be etched. Generally, this etch has high selectivity between materials, thereby etching dielectric areas 102 much more quickly than patterned silicon layer 101. In some embodiments, a mask can be used to further protect patterned silicon layer 101 during the etching of dielectric areas 102.

Unfortunately, the etch rate across a wafer is typically not perfectly uniform due to equipment imperfections, variations in IC pattern density, and/or inherent conditions associated with the etch process being used. For example, it is not uncommon to have an etch rate variation of 10% across a wafer. The etch rate variation causes non-uniform etching of dielectric areas 102. Non-uniformity of etched dielectric areas 102A, as shown in FIG. 1B, results in variations of vertical device dimensions across a chip, within a wafer, or even from wafer to wafer. In turn, these vertical device dimension variations may result in significant device and circuit performance variations, which is highly undesirable.

Therefore, a need arises for a technique for providing uniform etch depth to minimize device and circuit performance variations.

SUMMARY OF THE INVENTION

A method of performing a timed etch of a material to a precise depth is provided. In this method, ion implantation of the material is performed before the timed etch. This ion implantation process substantially enhances the etch rate of the material within a precisely controlled depth range corresponding to the range of implantation-induced damage. That is, the damaged material etches significantly faster than the undamaged material. Note that the range of the implantation-induced damage can be tailored by adjusting the implanted ion species, dose, and energy. Generally, the larger the ion mass, the lower the dose required to induce a threshold level of damage required to enhance the etch rate. For example, if argon (Ar) is the implanted ion species, a dose of 1E14 per square centimeter can be adequate to significantly enhance the etch rate of silicon dioxide. The depth to which a threshold level of damage is achieved increases approximately logarithmically with the implanted dose, whereas it increases linearly with the projected ion range that is determined by the implant energy.

Advantageously, by performing the ion implantation prior to etching, the variation in vertical etch depth can be reduced by a factor approximately equal to the etch rate of the damaged material divided by the etch rate of the undamaged material. The vertical etch depth can be used to provide a vertical dimension of a non-planar semiconductor device. Minimizing vertical device dimension variations on a wafer can reduce device and circuit performance variations, which is highly desirable.

DETAILED DESCRIPTION OF THE INVENTION

In accordance with one aspect of the invention, ion implantation can be used to improve the uniformity and controllability of a timed etch. As described below, this ion implantation can advantageously enhance the etch rate within a depth range that reaches down to a desired etch depth.

Figure 1A:
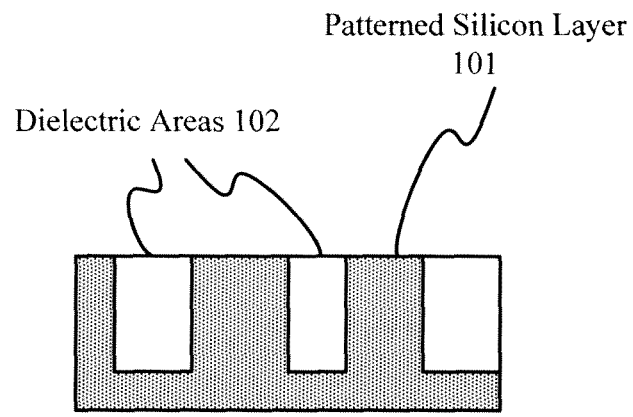
FIG. 1A illustrates a cross-sectional view of a patterned silicon layer and dielectric areas therein that can provide electrical isolation.
Figure 2:
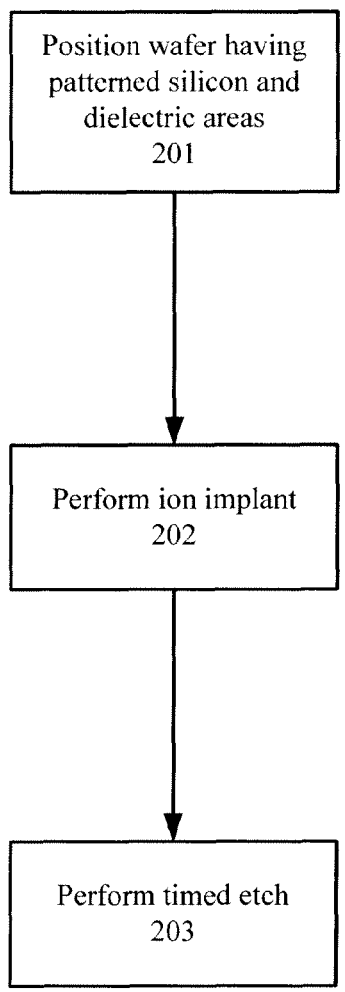
FIG. 2 illustrates exemplary steps for improving the uniformity and controllability of a timed etch.

FIG. 2 illustrates exemplary steps for improving the uniformity and controllability of a timed etch. In step 201, a wafer having patterned silicon and dielectric areas can be positioned for an etching process. This wafer could have a simplified cross-section similar to that shown in FIG. 1A.

Figure 3:
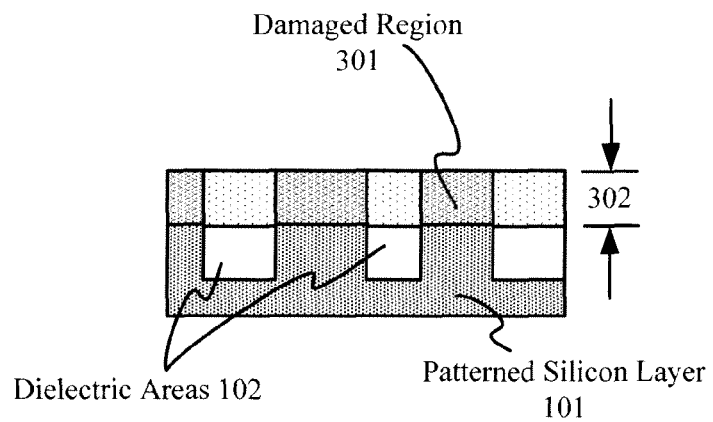
FIG. 3 illustrates the patterned silicon layer and dielectric areas of FIG. 1A after an ion implantation process that can advantageously enhance the dielectric etch rate.

In step 202, an ion implantation process can be performed. The implantation effectively "damages" the upper portions of the silicon and dielectric areas. In other words, much like spraying a plaster wall with bullets can facilitate the subsequent removal of the plaster, ion implantation can accelerate the subsequent removal of the implanted material during a subsequent timed etch. As shown in FIG. 3, damaged region 301 (shown by the dotted, semi-transparent area) has a depth 302 within the dielectric areas. Note that the depth of the damaged region 301 within the silicon areas may be different than depth 302. Depth 302 is determined by the implant species (e.g. Argon), the dose of the implant (e.g. 1E14 per square centimeter), and the energy of the implant. Notably, ion implantation is an extremely uniform process (e.g. dose and energy of an implant species can be controlled within 1% across a wafer and from wafer to wafer). As a result, depth 302 can be controlled to a precise depth range.

Figure 4:
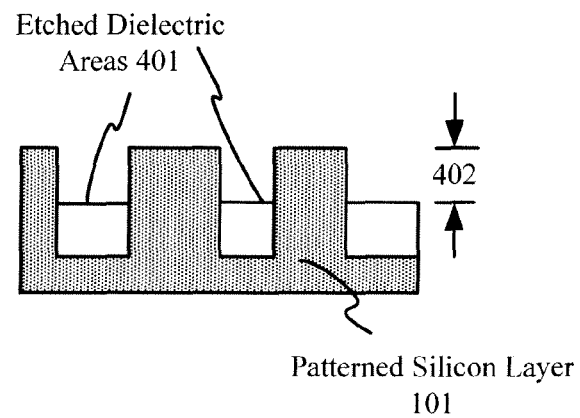
FIG. 4 illustrates the patterned silicon layer and dielectric areas of FIG. 1A after an ion implantation process and a timed dielectric etch.

Therefore, referring back to FIG. 2, when a timed etch (e.g. a wet etch such as a diluted hydrofluoric acid solution or a dry etch such as a plasma etch including fluorine radicals) is performed in step 203, the etch depth of the dielectric areas can be precisely controlled. Specifically, as shown in FIG. 4, the etched dielectric areas 401 have an etch depth 402 that is substantially identical to the depth 302 (FIG. 3) of damaged region 301 within the dielectric areas. This is because the etch rate of the damaged dielectric is significantly enhanced as compared with the etch rate of the underlying undamaged dielectric. Thus, once the timed etch reaches the undamaged dielectric, i.e. the dielectric areas below depth 302, the etching rate dramatically slows.

Advantageously, by accelerating the etch rate by a factor of X (greater than 1), the amount of time needed to etch the damaged dielectric areas can be reduced by a factor of 1/X. Therefore, the over-etch time needed to ensure that all dielectric areas on the wafer are etched to at least the desired etch depth can also be reduced by a factor of 1/X. Reducing the over-etch time can significantly minimize etch depth variations across the wafer. Thus, by enhancing the etch rate within a precise depth range that reaches down to the desired etch depth, the uniformity and controllability of a timed dielectric etch process can be significantly improved.

Note that damaged region 301 also includes portions of patterned silicon layer 101. The damage within the silicon can be easily repaired by thermal annealing at a temperature greater than approximately 500 degrees Celsius to re-crystallize the silicon epitaxially from the underlying undamaged portions. Such a thermal annealing process, which is called solid phase epitaxial re-crystallization (SPER), is well known to those in the integrated-circuit manufacturing industry. It can be performed either before or after the timed dielectric etch, preferably the latter to avoid partial healing of the intentional damage in the dielectric areas. The SPER temperature and duration should ideally be sufficiently low so as to minimize diffusion of any dopant atoms (e.g. Boron, Indium, Phosphorus, Arsenic, Antimony) within the silicon.

Exemplary Application: Corrugated-Channel MOSFET

By forming metal-oxide-semiconductor field effect transistors (MOSFETs) over a substrate having precisely-formed and regularly-spaced stripes (ridges of semiconductor material(s)), both high performance (i.e. high on-current) and low static power consumption (i.e. low source-to-drain leakage current) can be achieved with good uniformity. The stripes, which can be formed with the aid of an ion implantation process as described below, enable the formation of segmented channel regions that accommodate a wide range of gate-electrode configuration options and also provide greater performance consistency between devices.

Figure 5A:
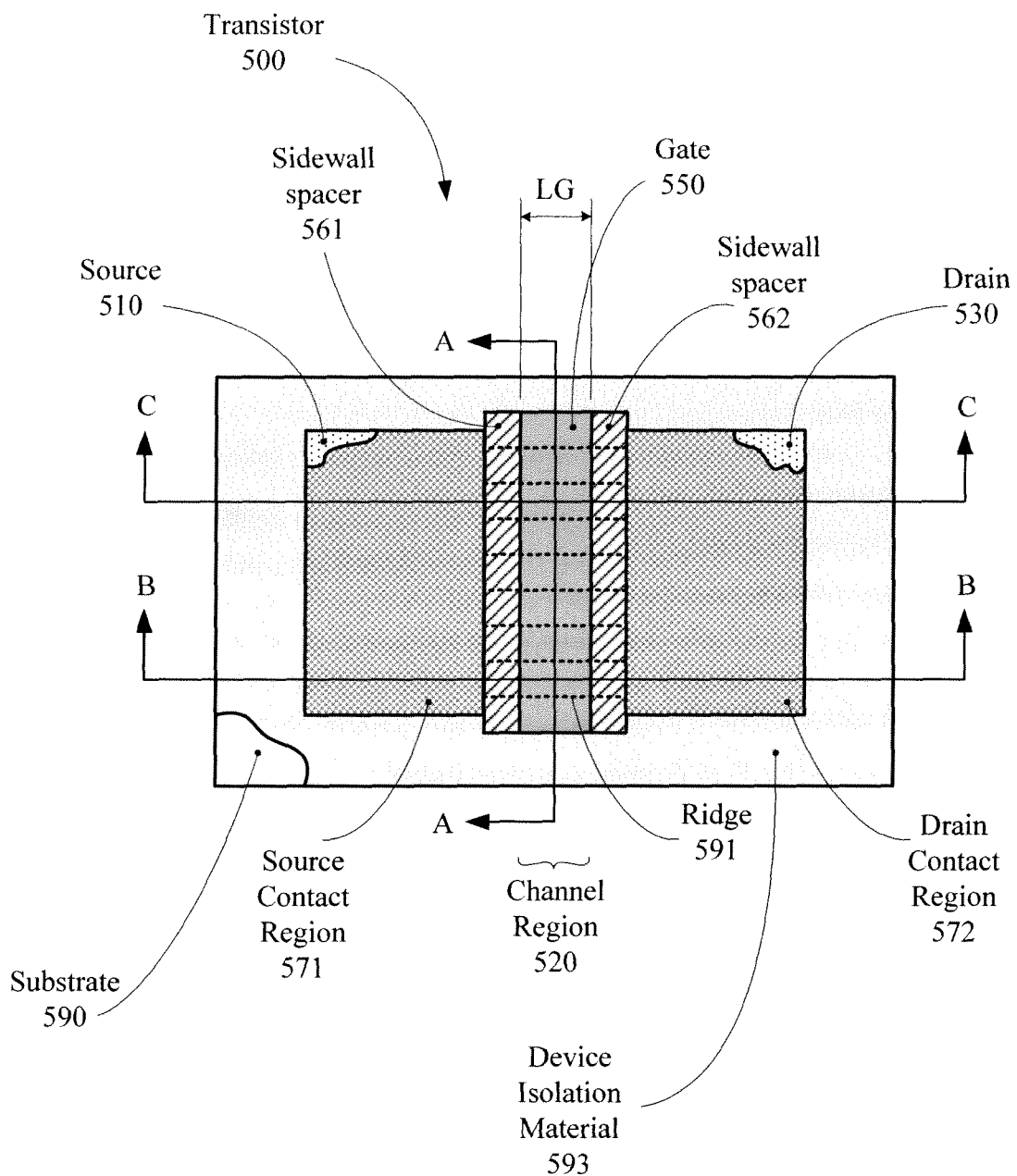
FIGS. 5A, 5B, 5C, 5D are various views of a transistor including a segmented channel region, wherein the ridge isolation material in the segmented channel region can be uniformly etched after an ion implantation process.

FIG. 5A shows a top view of an exemplary transistor 500 that includes a segmented channel region. Transistor 500 is formed on a substrate 590 and is surrounded by device isolation material 593 (e.g. shallow trench isolation), and includes a source 510, a drain 530, a gate 550, sidewall spacers 561 and 562, a source contact region 571, and a drain contact region 572. Gate 550 (with a gate length LG) is located between source 510 and drain 530 and is formed over a channel region 520 in substrate 590. Sidewall spacers 561 and 562 lie over at least a portion of source 510 and drain 530, respectively, and serve to offset the gate 550 from source contact region 571 and drain contact region 572, respectively. As indicated by the dotted lines, channel region 520 includes multiple ridges 591 that run between source 510 and drain 530. Ridges 591 are formed from at least one semiconductor material and may be homogenous structures (e.g. silicon).

Figure 1B:
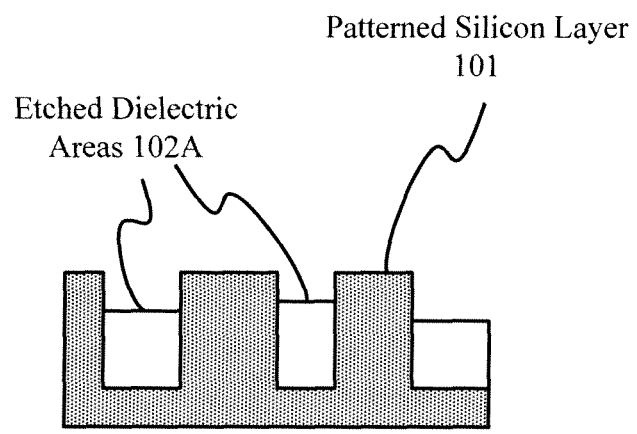
FIG. 1B illustrates the patterned silicon layer and dielectric areas of FIG. 1A after a timed dielectric etch process with etch rate variations has been applied.

Ridges 591 are formed on an elevated base region 595 that rises from substrate 590, as shown in FIG. 1B. FIG. 1B is a cross-sectional view of transistor 500 through view location A-A (rotated 90° for clarity). Each ridge 591 has a width W, and is spaced from adjacent ridges by a spacing SP. Furthermore, each ridge 591 extends a height HR above elevated base region 595, which itself rises a height HB from the adjacent surfaces 590-S of substrate 590.

Note that because ridges 591 are identified relative to substrate 590, ridges 591 continue to exist as "ridges" even covered with other materials (e.g. even though ridge isolation material 592, device isolation material 593, gate dielectrics 540, and gate 550 completely cover ridges 591, ridges 591 are still considered to be ridges.) As described in greater detail below, each of ridges 191 is a highly precise structure that therefore provides highly quantifiable performance measures.

Transistor 500 is isolated from adjacent devices by device isolation material 593 (e.g. silicon dioxide), which extends down to surfaces 590-S of substrate 590 (i.e. down to the bottom of elevated base region 595). Ridge isolation material 592 (which can be formed from the same material(s) or different material(s) than device isolation material 593) fills the inter-ridge regions to a distance HG below the top of ridges 591. Gate 550 is formed over the top portions of ridges 591, separated from those top portions by gate dielectric 540 (which can be formed from any dielectric material(s)). Thus, when appropriate voltages are applied to gate 550 and between source 510 and drain 530, each of ridges 591 conducts a portion of the total on-current that flows through transistor 500.

Note that gate dielectric 540 and gate 550 "wrap" around the top portions of ridges 591 (i.e. gate dielectric 540 and gate 550 extend down the sides of ridges 591). This wrapping configuration allows gate 550 to more effectively control the electric potential distribution within channel region 520, and can therefore enhance on-current while minimizing source-to-drain leakage current.

Figure 5B:
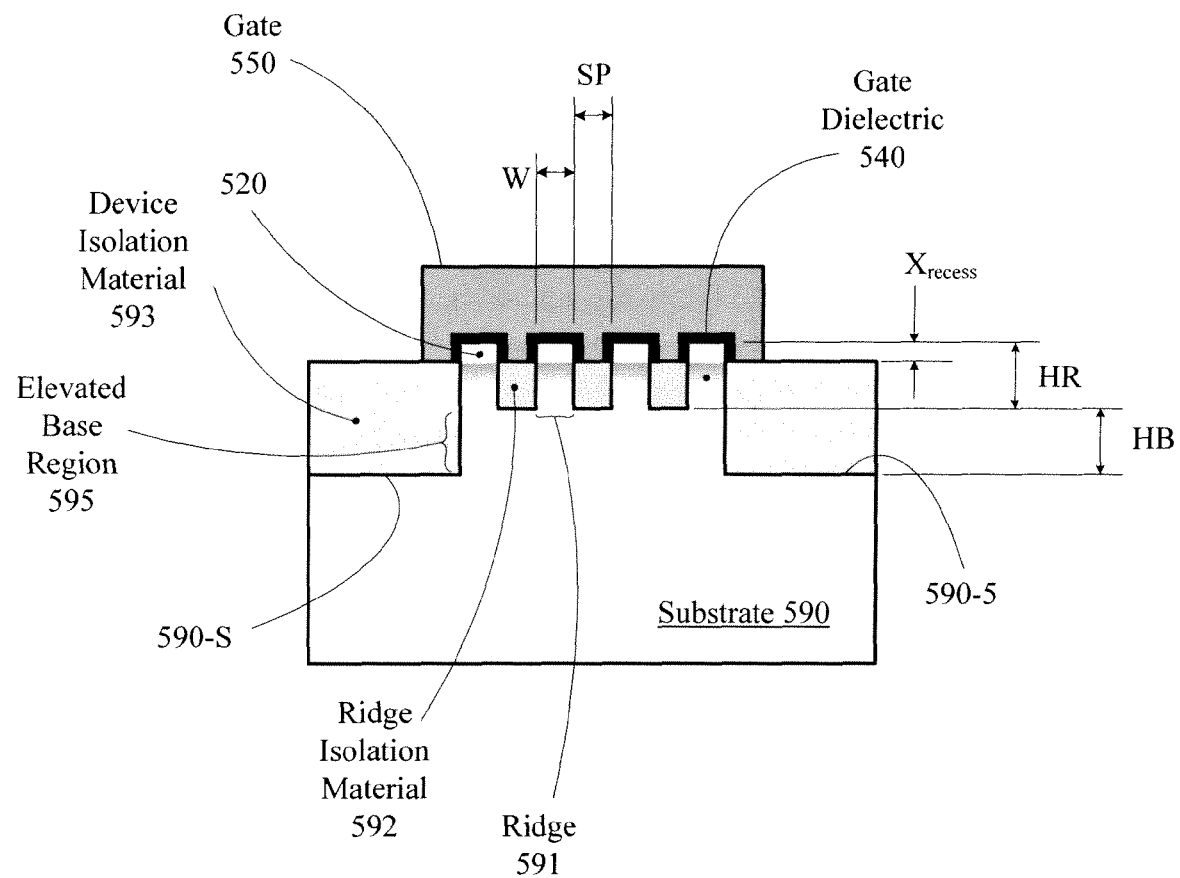
Figure 5C:
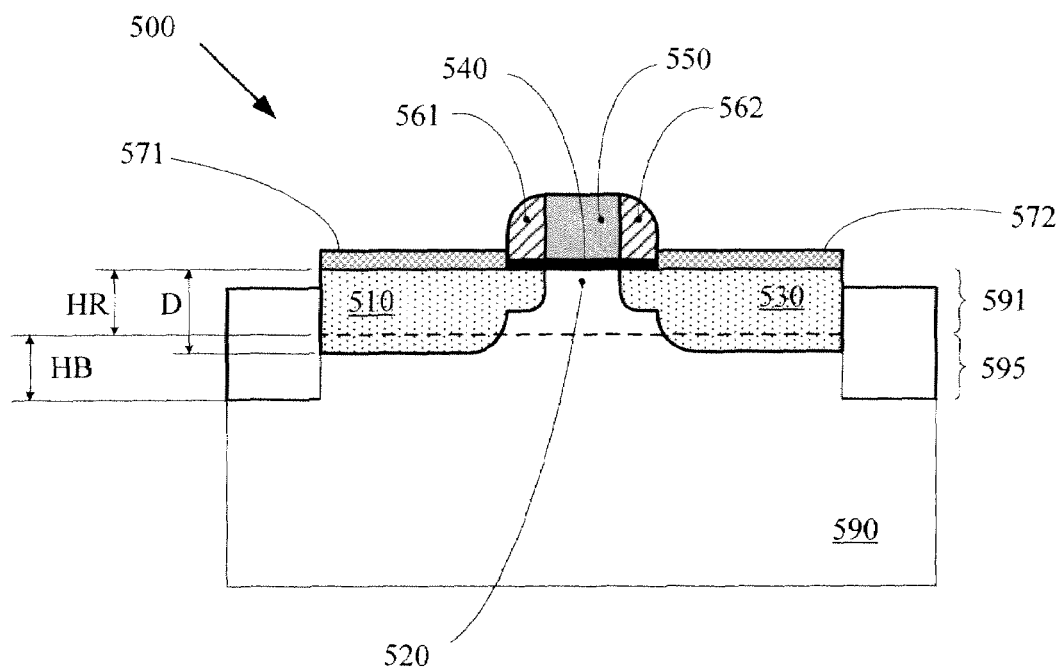

FIG. 5C shows a cross-sectional view of transistor 500 through view location B-B indicated in FIG. 5A. View location B-B provides a cross-sectional view running parallel to the direction of current flow between source 510 and drain 530 and through one of ridges 591, and therefore indicates the full doping profiles in and around channel region 520. As indicated in FIG. 5C, source 510 and drain 530 are doped regions within ridge 591.

Note that while depicted as extending below the bottom of ridges 591 for exemplary purposes, the depth D of source 510 and drain 530 below the surface of ridge 591 can alternatively be less than the overall height HR of ridge 591 (i.e. depth D is less than ridge height HR), so that ridge isolation material 592 (shown in FIG. 5B), which starts from the base of ridge 591, can effectively reduce the area of the junction between the source 510 and substrate 590, and the area of the junction between the drain 530 and substrate 590, thereby reducing junction leakage and capacitance.

Figure 5D:
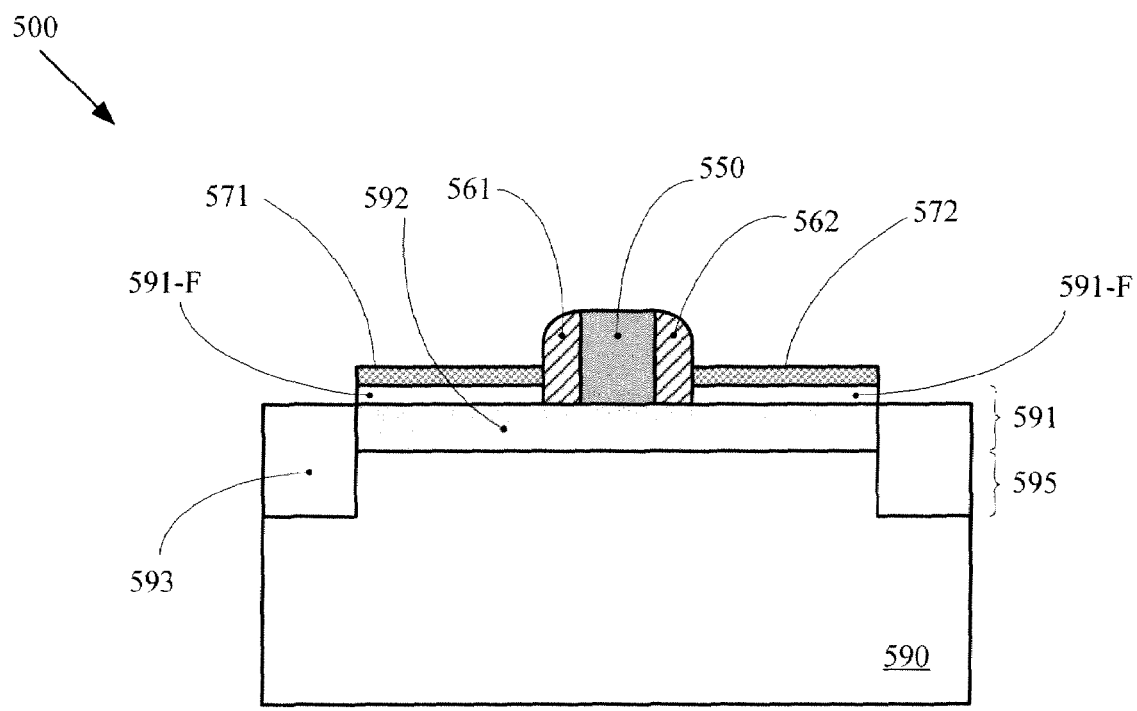

FIG. 5D shows a cross-sectional view of transistor 500 through view location C-C indicated in FIG. 5A. View location C-C runs between two ridges 591, parallel to the direction of current flow between source 510 and drain 530. Therefore, FIG. 5D depicts gate 550 (and sidewall spacers 561 and 562) extending down below the top surface of ridge 591. Specifically, gate 550 extends down to the level of ridge isolation material 592. Note that because view location C-C runs between ridges 591, the portions of source 510 and drain 530 on either side of gate 550 (and sidewall spacers 561 and 562, if present) are actually fill regions 591-F (i.e. regions formed by filling the space between the exposed portions of adjacent ridges 591). U.S. patent application Ser. No. 11/173, 237, entitled "Segmented Channel MOS Transistor" and filed on Jul. 1, 2005 by Synopsys, Inc., describes transistor 500 in greater detail and is incorporated by reference herein.

Table 1 shows sample data for comparing the performance (on-state drive current and off-state source-to-drain leakage current, each normalized to the transistor layout width) of various n-channel implementations of transistor 500 (rows 1, 2, 3, and 4) against the performance specifications with no carrier mobility enhancement as published in the International Technology Roadmap for Semiconductors (ITRS), 2003 Edition (rows 7 and 8). Each of the implementations of transistor 500 is based on a fundamental set of implementation values, including a single ridge 591 in the channel region, a 20 nm spacing between ridges 591 (i.e. the total layout width of the simulated transistor 500 is the ridge width W plus 20 nm), a thickness for gate dielectric 540 equivalent to 1.2 nm of $SiO_2$, an undoped channel, a heavily p-type doped ($2 \times 10^{19}$ $cm^{-3}$ boron) pulse doped region starting precisely at the end of the gate overlap (i.e. at a distance $X_{recess}$ below the surface of the ridge), no stress-based mobility enhancement, and singly doped source/drain regions.

TABLE 1

| No. | Description | W (nm) | LG (nm) | Xrecess (nm) | Ion (mA/μm) | Ioff (nA/μm) |
|---|---|---|---|---|---|---|
| 1 | Slightly Recessed | 20 | 20 | 5 | 0.5 | $3 \times 10^{-6}$ |
| 2 | Moderately Recessed | 20 | 20 | 10 | 0.6 | 0.4 |
| 3 | Very Recessed | 20 | 20 | 15 | 0.98 | 500 |

As indicated in Table 1, design number 1, which incorporates a ridge width of 20 nm, a gate length of 20 nm, and a recess distance $X_{recess}$ of 5 nm (a "Slight Recess"), provides an on-state drive current $I_{on}$ of 0.5 mA/μm and an off-state source-to-drain leakage current $I_{off}$ of $3 \times 10^{-6}$ nA/μm. Note that $I_{on}$ and $I_{off}$ are listed in terms of current per micron layout width (in the direction transverse to the direction of current flow) to normalize the current values. Increasing the recess distance $X_{recess}$ to 10 nm in design number 2 provides an increase in $I_{on}$ to 0.6 mA/μm, at the trade-off of increasing $I_{off}$ to 0.4 nA/μm. Further increasing recess distance $X_{recess}$ to 15 nm in design number 3 provides a significant jump in $I_{on}$ to 0.98 mA/μm, but increases $I_{off}$ to 500 nA/μm. Thus, implementing transistors using values similar to design number 3 would generally be best for high performance circuits, whereas implementing transistors using values similar to design number 1 would be best for ultra-low power circuits.

As indicated by the performance values provided for design numbers 1-3, the relationship between on-current $I_{on}$ and off-current $I_{off}$ can be adjusted via recess distance $X_{recess}$; i.e. the depth of the heavily p-type doped region. In contrast, the $I_{on}/I_{off}$ relationship in conventional transistors is typically modified by adjusting the doping concentration within the channel region to achieve a particular threshold voltage. Because dimensional control (i.e. control over recess distance $X_{recess}$ and depth of the heavy channel doping profile) can be more precise than dopant concentration control (i.e. control over the number of dopant atoms in the channel region), transistors having a corrugated channel made using the above-described ion implantation process and a subsequent timed etch can significantly ease the difficulties associated with achieving a particular combination of on-current $I_{on}$ and off-current $I_{off}$.

Additional Exemplary Applications

Figure 6:
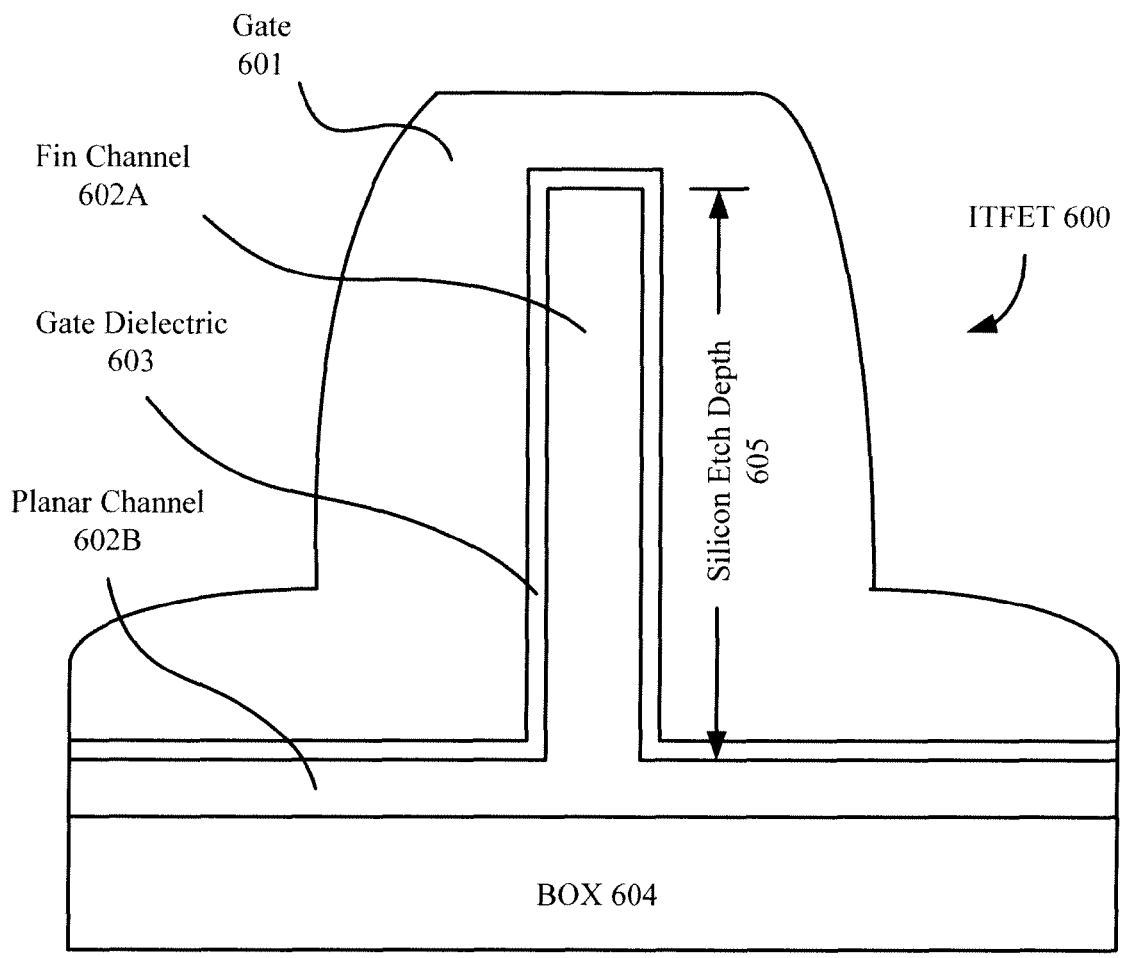
FIG. 6 illustrates the cross-section of a portion of an inverted-T-channel field-effect transistor (ITFET) for which an ion implantation process can be used to form uniformly thin horizontal portions of the channel.

Advantageously, ion implantation can be used to control etching depth in materials other than oxide. For example, FIG. 6 illustrates a cross-sectional view of an inverted T-channel field-effect transistor (ITFET) 600. ITFETs are described in "Inverted T channel FET (ITFET)—Fabrication and Characteristics of Vertical-Horizontal, Thin Body, Multi-Gate, Multi-Orientation Devices, ITFET SRAM Bit-cell operation. A Novel Technology for 45 nm and Beyond CMOS", which was authored by L. Mathew et al. and published by IEEE in 2005.

In ITFET 600, fin channel 602A and planar channel 602B, which are formed on a buried oxide (BOX) layer 604, provide both vertical and horizontal channel regions (hence the "inverted T" designation). After formation of fin channel 602A and planar channel 602B, a thin gate dielectric 603 can be formed on fin channel 602A and planar channel 602B. Then, a polycrystalline-silicon layer can be deposited and patterned to form a gate 601 for ITFET 600.

Notably, the thickness of planar channel 602B (i.e. the horizontal portions of the channel) determines the threshold voltage of ITFET 600. Therefore, the etching of the silicon layer to form fin channel 602A and planar channel 602B is critical to the performance of ITFET 600.

Advantageously, the above-described ion implantation process can precede the timed etch of the silicon to provide a precise silicon etch depth 605. In one embodiment, the dopant species used in this ion implantation can include germanium at a dose greater than or equal to 1E14 per square centimeter. The depth to which a threshold level of damage can be precisely controlled by adjusting the dose and energy of the implanted species. By enhancing the silicon etch rate within a precise depth range, the uniformity and controllability of the silicon etch process can be substantially improved, thereby minimizing ITFET performance variations across a wafer.

Figure 7:
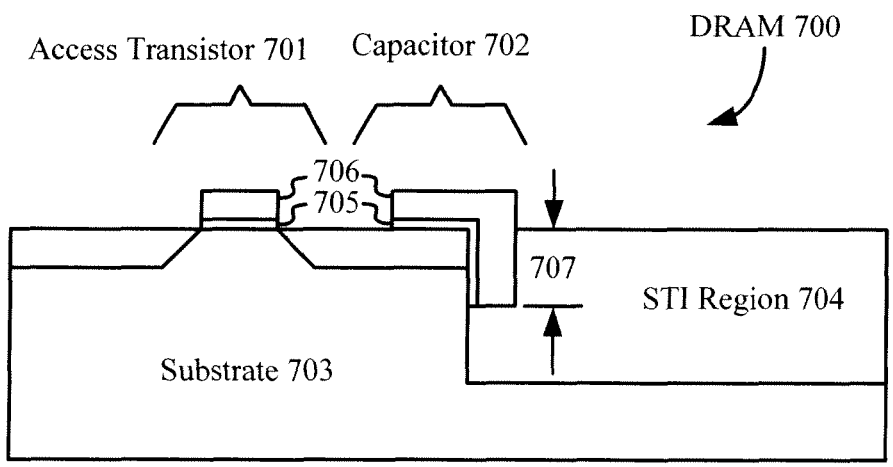
FIG. 7 illustrates an exemplary dynamic random access memory (DRAM) cell including a capacitor, wherein an ion implantation process can be used to accurately and uniformly form the sidewall portion of the capacitor.

The use of an ion implantation process to improve etch depth uniformity can be applied to various types of devices having vertical surfaces. For example, FIG. 7 illustrates an exemplary dynamic random access memory (DRAM) cell 700 including an access transistor 701 and a capacitor 702 fabricated in a semiconductor substrate 703. Capacitor 702 is partially formed in a cavity of a shallow trench isolation (STI) region 704, which is adjacent to a sidewall region of substrate 703. A patterned polycrystalline-silicon layer 706 can be used to form the electrodes of access transistor 701 and capacitor 702. The portion of capacitor 702 formed in the sidewall region can increase its capacitance with a minimum of layout area.

Notably, the junction of this sidewall portion with the horizontal portion of capacitor 702 may result in some undesirable leakage. However, the depth of the sidewall portion can compensate for such leakage. A recess depth 707 of STI region 704 in which this sidewall portion of capacitor 702 is formed can significantly affect the final capacitance of capacitor 702. Therefore, the etching of STI region 704 (e.g. a field oxide) to form capacitor 702 is critical to its performance. Advantageously, the above-described ion implantation process can precede the timed etch of STI region 704 to accurately and uniformly provide recess depth 707. By enhancing the etch rate of STI region 704 within a precise depth range, the uniformity and controllability of the STI region etch process can be substantially improved, thereby minimizing variations of capacitances across a wafer.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, in one application, the fin height of FinFETs (transistor structures with fin-like channel regions) made on bulk silicon wafers can be determined by using the above-describe ion implantation and timed etch to provide precise control of etch depth, thereby minimizing FinFET performance variations. Accordingly, it is intended that the scope of the invention be defined by the following Claims and their equivalents.

The invention claimed is:

1. A wafer comprising:
   ridged semiconductor material subjected to a first ion implantation, thereby damaging the ridged semiconductor material;
   an isolation material formed between ridges of the ridged semiconductor material, the isolation material subjected to the first ion implantation, thereby damaging the isolation material, and then etched to a precise depth having a variation less than 10% across the wafer; and
   a dielectric layer disposed on a top surface of each said ridge, and extending down each side surface of each said ridge to said isolation material.

2. The wafer of claim 1, wherein the isolation material is a dielectric.

3. The wafer of claim 1, wherein the isolation material is silicon dioxide.

4. The wafer of claim 1, wherein the isolation material is a field oxide.

5. The wafer of claim 1, wherein the ridged semiconductor material forms a transistor with a segmented channel region.

6. The wafer of claim 1, wherein the ridged semiconductor material forms an inverted T-channel field-effect transistor (ITFET).

7. The wafer of claim 1, wherein the ridged semiconductor material forms a capacitor.

8. The wafer of claim 1, wherein the ion implantation includes argon.

9. The wafer of claim 1, wherein the ion implantation includes germanium.

10. The wafer of claim 1, further comprising a gate disposed on said dielectric layer and extending below the top surfaces of said ridges and between said ridges to said isolation material.

* * * * *